US008742546B2

(12) United States Patent
Kato

(10) Patent No.: US 8,742,546 B2
(45) Date of Patent: Jun. 3, 2014

(54) SEMICONDUCTOR DEVICE WITH A PLURALITY OF DOT PATTERNS AND A LINE PATTERN HAVING A PROJECTION PART

(76) Inventor: Kohei Kato, Tokyo (JP)

( * ) Notice: Subject to any disclaimer, the term of this patent is extended or adjusted under 35 U.S.C. 154(b) by 0 days.

(21) Appl. No.: 13/461,261

(22) Filed: May 1, 2012

(65) Prior Publication Data

US 2012/0280364 A1 Nov. 8, 2012

(30) Foreign Application Priority Data

May 2, 2011 (JP) ................... 2011-102763

(51) Int. Cl.
*H01L 29/06* (2006.01)
*H01L 23/58* (2006.01)

(52) U.S. Cl.
USPC .............. 257/618; 257/798; 257/E21.036; 257/E21.037; 257/E21.038; 257/E21.039

(58) Field of Classification Search
USPC ............ 257/618, 798, E21.036, E21.037, 257/E21.038, E21.039
See application file for complete search history.

(56) References Cited

U.S. PATENT DOCUMENTS

| | | | | |
|---|---|---|---|---|
| 4,716,314 A * | 12/1987 | Mulder et al. | ................ | 326/100 |
| 5,190,463 A * | 3/1993 | Datta et al. | ................ | 439/74 |
| 6,858,875 B2 * | 2/2005 | Hamano et al. | ................ | 257/88 |
| 7,564,122 B2 * | 7/2009 | Yee et al. | ................ | 257/666 |
| 7,679,202 B2 * | 3/2010 | Yoshida et al. | ................ | 257/797 |
| 7,767,507 B2 * | 8/2010 | Park et al. | ................ | 438/166 |
| 7,811,722 B2 * | 10/2010 | Moon | ................ | 430/5 |
| 7,825,031 B2 * | 11/2010 | Manger et al. | ................ | 438/705 |
| 8,496,313 B2 * | 7/2013 | Ueshima | ................ | 347/14 |
| 8,564,033 B2 * | 10/2013 | Hayashi et al. | ................ | 257/291 |
| 2004/0110095 A1 * | 6/2004 | Imai et al. | ................ | 430/311 |
| 2007/0212806 A1 * | 9/2007 | Ito | ................ | 438/99 |
| 2008/0085479 A1 * | 4/2008 | Yamaguchi et al. | ................ | 430/327 |
| 2008/0286454 A1 * | 11/2008 | Yamamoto et al. | ................ | 427/162 |
| 2008/0292976 A1 * | 11/2008 | Terasaki et al. | ................ | 430/5 |
| 2009/0062723 A1 * | 3/2009 | Skiba | ................ | 604/20 |
| 2009/0208886 A1 * | 8/2009 | Takemura et al. | ................ | 430/326 |
| 2010/0079518 A1 * | 4/2010 | Yamazaki | ................ | 347/9 |
| 2011/0234676 A1 * | 9/2011 | Nishikawa | ................ | 347/19 |
| 2011/0236831 A1 * | 9/2011 | Hasegawa et al. | ................ | 430/285.1 |
| 2011/0262047 A1 * | 10/2011 | Wei | ................ | 382/232 |
| 2013/0004669 A1 * | 1/2013 | Mataki | ................ | 427/277 |
| 2013/0105807 A1 * | 5/2013 | Im et al. | ................ | 257/66 |

FOREIGN PATENT DOCUMENTS

| | | |
|---|---|---|
| JP | 2000-122263 | 4/2000 |
| JP | 2007-194492 | 8/2007 |
| JP | 2008-116862 | 5/2008 |
| JP | 2010-191403 | 9/2010 |

* cited by examiner

*Primary Examiner* — Ida M Soward
(74) *Attorney, Agent, or Firm* — Young & Thompson

(57) ABSTRACT

A semiconductor device includes a first pattern and a plurality of second patterns arranged at equal intervals. When the distance of the space between the first pattern and the second pattern closet to the first pattern is larger than a first distance, a plurality of dummy patterns are arranged in the space with shapes and intervals similar to those of the second patterns. When the distance of the space is equal to or less than the first distance and larger than a second distance, the dummy pattern is spaced from the second pattern closest to the first pattern, and extends toward the first pattern to be brought into contact with the first pattern. When the distance of the space is equal to or less than the second distance, the dummy pattern is spaced from the second pattern closest to the first pattern, and is connected to the first pattern.

9 Claims, 15 Drawing Sheets

SEMICONDUCTOR DEVICE WITH A PLURALITY OF DOT PATTERNS AND A LINE PATTERN HAVING A PROJECTION PART

This application is based upon and claims the benefit of priority from Japanese Patent Application No. 2011-102763 filed on May 2, 2011, the content of which is incorporated by reference.

BACKGROUND OF THE INVENTION

1. Technical Field

The present invention relates to a photomask and a semiconductor device.

2. Description of Related Art

In a manufacturing method of a semiconductor device, there are known a photolithography process and an etching process as a method for forming a desired pattern on a processed film such as an insulating film or a conductive film on a semiconductor substrate. The photolithography process includes the exposure process and development process. An exposure device used for the exposure process is briefly described.

FIG. 1 is a sectional view schematically showing a configuration example of the exposure device that uses the related photomask. As shown in FIG. 1, the exposure device includes light source 1, condenser lens 2, photomask 3, reduced projection lens 4, and stage 6. An argon-fluoride (ArF) laser is used for light source 1. A wavelength of the light source, which is not limited to that of the ArF laser, can be a wavelength longer or shorter than that of the ArF laser.

Photomask 3, which is located between condenser lens 2 and reduced projection lens 4, is changed according to a pattern formed on the processed film. In photomask 3, a pattern is formed on a light shielding film of chromium (Cr) on a glass substrate. In this case, photomask 3 is presumed to be a size-increased mask having a lager size than the real size of a pattern projected to wafer 5. This size-increased mask is referred to as a "reticle". A certain type of a reticle has patterns equivalent to a plurality of chips formed on a glass substrate of one reticle.

Wafer 5, which has the processed film and a resist film stacked on the semiconductor substrate, is mounted on stage 6. Stage 6 can move wafer 5 in each of a horizontal direction (X direction) and a depth direction (Y direction) shown by a driving unit (not shown).

Next, the exposure process using the exposure device shown in FIG. 1 is briefly described. It is presumed that photomask 3 has first been set in the exposure device and then wafer 5 having a photosensitive polymer uniformly applied as a photoresist on the surface has been mounted on stage 6.

As shown in FIG. 1, light emitted from light source 1 is adjusted to be almost vertical during passage through condenser lens 2 to be applied to photomask 3. The light transmitted through photomask 3 is set to an intensity according to the brightness and darkness of photomask 3, reduced by reduced projection lens 4, and then applied to wafer 5, thereby forming a pattern on the photoresist according to the light intensity. Each time light irradiation process is performed to irradiate the photoresist with light via photomask 3 and reduced projection lens 4 for a given period of time, stage 6 on which wafer 5 is supported is moved in one of the X direction and the Y direction, and the light irradiation process is repeated. The photoresist is thoroughly irradiated with the light so as to prevent overlapping of areas irradiated with the light. This enables formation of a plurality of patterns on the entire photoresist according to the light intensity.

Photosensitive components contained in the photoresist vary in reaction speed from one light intensity to another for pattern formation on the photoresist. Hence, in the development process after the exposure process, the patterns of photomask 3 are transferred to the photoresist by using a difference, between the reaction speeds, in solubility of the photoresist in a developer. Thus, the patterns of photomask 3 are exposed with the light intensity based on the brightness and darkness of photoresist 3 to be transferred to wafer 5.

Next, as a specific example of exposure process, a method for transferring a line pattern and a plurality of dot patterns to the photoresist is described. The transferring status of the patterns of photomask 3 to the photoresist is described in detail referring to the expanded view of broken-line part 7 and broken-line part 8 of photomask 3 shown in FIG. 3.

FIGS. 2A to 2C are explanatory views showing a pattern forming method that uses the related photomask.

FIG. 2A shows a partial configuration of related photomask 500: an upper side being a plan view of photomask 500, and a lower side being a sectional view of the AA part shown in the plan view. FIG. 2B is a graph showing an intensity distribution when the light from the light source is transmitted through photomask 500 shown in FIG. 2A and the optimal focus is set on the surface of the photoresist. FIG. 2C shows a pattern shape of the photoresist after development when exposure is carried out with the light intensity shown in FIG. 2B: an upper side being a plan view, and a lower side being a sectional view of a BB part shown in the plan view.

As shown in FIG. 2A, in photomask 500, line pattern 10 is disposed on the rear surface of substrate 9 to extend in the Y direction, and a plurality of dot patterns are arranged in a grid pattern on the rear surface of substrate 9 in the X and Y directions. An area in which the plurality of dot patterns are arranged in the grid pattern in the X and Y directions is denoted by reference numeral 11. Line pattern 10 and a plurality of dot patterns are formed by light shielding films in which chromium and a chromium oxide (CrOx) are stacked.

Hereinafter, for simpler description, the plurality of dot patterns arranged in photomask 500 are divided into a plurality of groups, a plurality of patterns arranged at equal intervals in the Y direction constituting one group, and the patterns of each group is referred to as "dot patterns". FIG. 2a shows dot pattern 11a and dot pattern 11b.

Dot pattern 11a closest to line pattern 10 is located away from line pattern 10 by space 12, and away from adjacent dot pattern 11b by space 13. Space 12 has width X1 in the X direction, and space 13 has width X2 in the X direction.

For convenience, widths that are lengths of line pattern 10 and dot patterns 11a and 11b in the X direction are set equal. Width X1 is larger than width X2, and the respective patterns are arranged so that space 12 between line pattern 10 and dot pattern 11a can be larger than space 13 between adjacent dot patterns 11a and 11b. Though not shown, a pattern identical to line pattern 10 is disposed on the left side of line pattern 10 via a space having width X2, and a pattern identical to dot pattern 11b is disposed on the right side of dot pattern 11b via a space having width X2.

In light intensity graph 200 shown in FIG. 2B, a horizontal axis indicates positions of the patterns and the spaces of photomask 500, and a virtual axis indicates light intensity. Light intensity is plotted on the photoresist surface according to the position of each of the patterns and the spaces.

As shown in FIG. 2B, the light intensity greatly varies from one position to another of the patterns and the spaces, and becomes minimum value 14 at the center of each of line pattern 10 and dot patterns 11a and 11b in photomask 500.

The intensity value, which is set to minimum value 14 at these positions, never becomes zero. This is because the patterns of photomask 500 block the light from the light source, and a part of the light transmitted through spaces 12 and 13 becomes diffracted light due to a diffraction phenomenon, and moves around to the lower surface of each pattern to reach the resist surface.

A diffraction angle θ with a vertical direction set as a base point is represented by a relational expression of sin θ=nλ/pitch, where λ is a wavelength of the light emitted from the light source, the pitch is a sum total of widths of the patterns and the spaces, and n is an index (n=±1, ±2, ... ) indicating an order (first-order diffraction, second-order diffraction, ... ) of the diffracted light. For example, one pitch of dot pattern 11a is represented by "width of dot pattern 11a+width X2 of space 13".

It can be understood from the relational expression that as the space becomes wider, the diffraction angle θ becomes smaller. In photomask 500 in which the patterns are formed with their widths set equal, as the wider is the space, the greater is the amount of light that moves around to the lower surface of each pattern, thereby increasing the amount of light to contribute to the exposure. Thus, as shown in FIG. 2B, light intensity 15 at the end of line pattern 10 facing space 12 which is wider than space 13, is larger by ∠1 than light intensity 16 at the opposite end. Similarly, light intensity 17 at the end of dot pattern 11a facing space 12, is wider by ∠2 than light intensity 18 at the opposite end.

However, light intensities 19 and 20 at the end of dot pattern 11b that faces narrow space 13 are stable at values almost equal to that of light intensity 18. The light intensity takes the maximum value at the center of the space. However, because of the abovementioned diffraction phenomenon, the light is greatly scattered in narrow space 13 to reduce the amount of light reaching the photoresist. Thus, maximum value 21 between dot pattern 11a and dot pattern 11b is smaller than maximum value 22 between line pattern 10 and dot pattern 11a. In FIG. 2B, threshold value 23 of the light intensity in the development process is indicated by a broken line and, in an area of the light intensity larger than threshold value 23, a positive photoresist is dissolved during the development process.

The light intensity accordingly varies depending on the arrangement of the patterns and the spaces. The light intensity greatly fluctuates especially in a peripheral part where the pattern density greatly differs in an area in which pluralities of identical patterns are arranged.

FIG. 2C shows a pattern shape of the photoresist after the development when the exposure is carried out with the light intensity shown in FIG. 2B. The photoresist is a positive type. As shown in FIG. 2C, processed film 25 is formed on semiconductor substrate 24 that is a part of the wafer, and the photoresist that becomes a processed mask of processed film 25 is formed on processed film 25. Then, the patterns of photomask 500 are transferred to the photoresist. Hereinafter, a pattern in which a line pattern is transferred to the photoresist is referred to as a line resist, and a pattern in which a dot pattern is transferred to the photoresist is referred to as a dot resist.

The patterns of the photoresist that becomes the processed mask are largely classified into line resist 26 and dot resist 27. Dot resist 27 is further classified into dot resist 27a adjacent to line resist 26 via space 28, and dot resist 27b adjacent to dot resist 27a via space 29.

In this case, since the photoresist is the positive type, the photoresist at the exposure place is removed by the development process to form spaces 28 and 29. Light intensity at the end facing space 28 increases due to diffracted light, and hence line resist 26 is formed smaller by width X3 than virtual end 30 when there is no diffracted light. Similarly, dot resist 27a facing space 28 is formed smaller by width X4 than virtual end 31. On the other hand, the longest part of dot resist 27b in the X direction is formed with a width almost equal to that of dot pattern 11b shown in FIG. 2A.

Thus, when the patterns of the peripheral part of the area in which the plurality of identical patterns are formed are formed smaller than the desired sizes, patterns in which these patterns are transferred to the processed film are also formed smaller than the desired shapes. As a result, the patterns formed small are easily peeled during the manufacturing process. When pattern peeling occurs, the problem of reduction in product yield is created.

The case where the exposure process is carried out with the optimal focus has been described referring to FIGS. 2A to 2C. A case where defocusing occurs is described referring to FIGS. 3A to 3C. The defocusing means a state where an out-of focus state is set to cause a formed image to blur.

FIG. 3A shows a partial configuration of related photomask 500: an upper side being a plan view of photomask 500, and a lower side being a sectional view of a CC part shown in the plan view. FIG. 3B is a graph showing an intensity distribution when the light from the light source is transmitted through photomask 500 shown in FIG. 3A and defocusing occurs on the surface of the photoresist. FIG. 3C shows a pattern shape of the photoresist when exposure is carried out with the light intensity shown in FIG. 3B: an upper side being a plan view, and a lower side being a sectional view of a DD part shown in the plan view.

Photomask 500 shown in FIG. 3A is similar in configuration to photomask 500 shown in FIG. 2A. To avoid repeated description, description of components similar to those shown in FIG. 2A is omitted.

In light intensity graph 210 shown in FIG. 3B, a horizontal axis indicates positions of the patterns and the spaces of photomask 500, and a virtual axis indicates light intensity. Light intensity is plotted on the photoresist surface according to the position of each of the patterns and the spaces. For comparison, light intensity graph 200 at the time of the optimal focus state shown in FIG. 2B is indicated by a broken line, and threshold value 33 equal to threshold value 23 is indicated by a broken line.

In light intensity graph 210, the light intensity at the time of the defocusing state, which has amplitude (difference between maximum value and minimum value) smaller than that at the time of the optimal focus state, greatly varies from one position to another of the patterns and the spaces, and becomes minimum value 32 at the center of each of line pattern 10 and dot patterns 11a and 11b in photomask 500. Minimum values 32a and 32b closest to wide space 12 are larger than minimum values 14a and 14b at the time of the optimal focus state, and are shifted to the inside of each pattern. Light intensity 34 at threshold value 33 is accordingly shifted more to the inside of each pattern than light intensity 35 at the time of the optical focus state. However, while minimum value 32c is larger than minimum value 14c at the time of the optimal focus state, there is no fluctuation in position.

Due to the influence of the abovementioned diffracted light, light intensity 36 at the end of line pattern 10 facing wide space 12, is larger by ∠3 than light intensity 37 at the opposite end. Similarly, light intensity 38 at the end of dot pattern 11a facing space 12, is wider by ∠4 than light intensity 39 at the opposite end. However, light intensities 40 and 41 at the end of dot pattern 11b facing narrow space 13 are stable at values almost equal to that of light intensity 39. The light intensity takes the maximum value at the center of each space. However, because of the abovementioned diffraction phenomenon, maximum value 42 in space 13 is smaller than maximum value 43 in space 12.

The light intensity where the exposure process is in the defocusing state greatly fluctuates as compared with that in the case of the optimal focusing state. The light intensity shifts especially in the peripheral part of an area where, among the plurality of identical patterns, patterns whose density have greatly changed are arranged.

FIG. 3C shows a pattern shape of the photoresist when the exposure is carried out with the light intensity shown in FIG. 3B. The photoresist is a positive type. As shown in FIG. 3C, processed film 45 is formed on semiconductor substrate 44 that is a part of the wafer, and the photoresist that becomes a processed mask of processed film 45 is formed on processed film 45. Then, the patterns of photomask 500 are transferred to the photoresist.

The patterns of the photoresist that becomes the processed mask are largely classified into line resist 46 and dot resist 47. Dot resist 47 is further classified into dot resist 47a adjacent to line resist 46 via space 48, and dot resist 47b adjacent to dot resist 47a via space 49.

Since the photoresist is the positive type, the photoresist at the exposure place is removed by the development process to form spaces 48 and 49. Light intensity at the end facing space 48 increases due to diffracted light, and hence line resist 46 is formed smaller by width X5 than virtual end 50 when there is no diffracted light. Due to the influence of shifted light intensity 34, line resist 46 becomes further smaller by X6. As a result, line resist 46 is formed smaller by (X5+X6) than line pattern 10. Similarly, dot resist 47a facing space 48 is formed smaller by (X7+X8) than virtual end 51. On the other hand, a longest part of dot resist 47b in the X direction is formed with a width almost equal to that of dot pattern 11b shown in FIG. 3A.

As described above, in the case of the defocusing state, there is a possibility that the patterns of the peripheral part of the area in which the plurality of identical patterns are formed may be formed much smaller than those in the case of the optimal focusing state. Thus, the patterns formed by transferring the patterns to the processed film are peeled more easily than that in the case of the optimal focusing state. When pattern peeling occurs, product yield is further reduced.

To prevent smaller formation of the patterns than desired shapes, there has been disclosed a method for arranging a dummy pattern. JP2010-191403A (hereinafter, Patent Literature 1) discloses formation of an auxiliary pattern symmetrical to a main pattern. JP2008-116862 (hereinafter, Patent Literature 2) discloses formation of a projection in an auxiliary pattern close to the leading end of a main pattern. JP 2007-194492 (hereinafter, Patent Literature 3) discloses arrangement of a dummy pattern having a projection at an extension part of a repetitive pattern (memory cell array). JP 2000-122263 (hereinafter, Patent Literature 4) discloses a mask pattern having a projection equal to or less than a resolution limit.

In the method disclosed in any one of Patent Literatures 1 to 4, in a case where defocusing occurs in repeatedly arranged dot patterns, the dot patterns may be deformed to be peeled even when dummy patterns are arranged. The peeled patterns cause the problem of a reduction in product yield.

SUMMARY

In one embodiment, there is provided a semiconductor device that includes a first pattern and a plurality of second patterns arranged at equal intervals. When a distance of a first space between the first pattern and, from among the plurality of second patterns, the second pattern closest to the first pattern is larger than a sum of a width of the second pattern and double the intervals of the plurality of second patterns, a plurality of dummy patterns are arranged in the first space with shapes and intervals similar to those of the second patterns. When the distance of the first space is equal to or less than the sum of the width of the second pattern and double the intervals of the plurality of second patterns, and larger than a sum of the width of the second pattern and the intervals of the plurality of second patterns, a dummy pattern similar in shape to the second pattern is spaced from the second pattern closest to the first pattern, and extends toward the first pattern to be brought into contact with the first pattern. When the distance of the first space is equal to or less than the sum of the width of the second pattern and the intervals of the plurality of second patterns, a dummy pattern similar in shape to the second pattern is spaced from the second pattern closest to the first pattern, and is connected to the first pattern.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 4A:
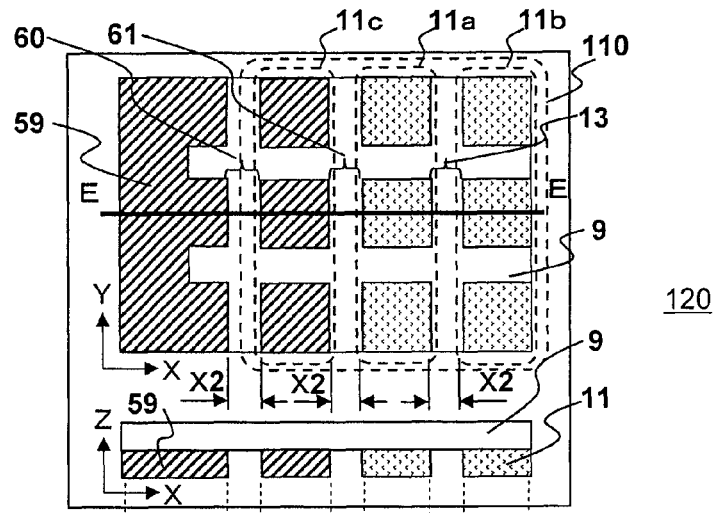
FIGS. 4A to 4C are explanatory views showing a photomask and resist patterns according to this embodiment.
Figure 4B:
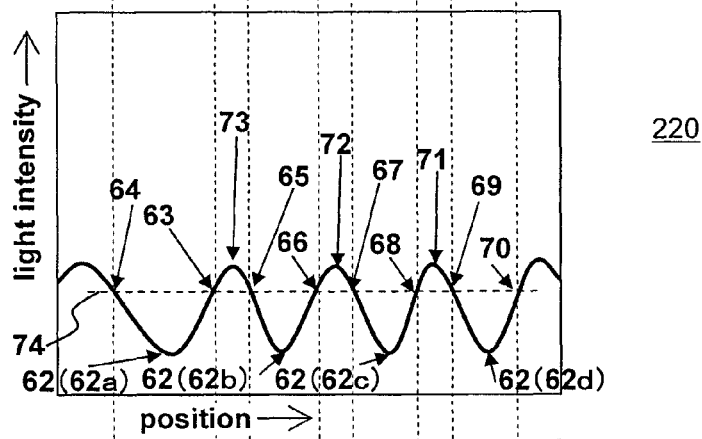
Figure 4C:
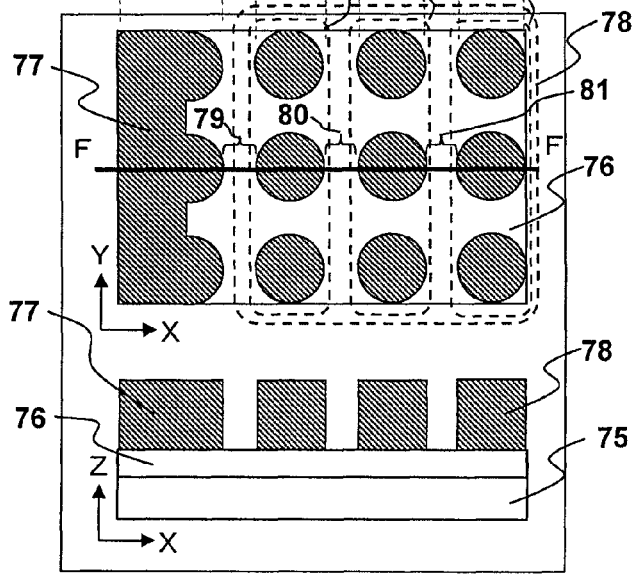

A photomask and resist patterns according to this embodiment are described. FIGS. 4A to 4C are explanatory views showing the photomask and the resist patterns according to this embodiment.

FIG. 4A shows a partial configuration of photomask 120 manufactured by a pattern arranging method described below: an upper side being a plan view of photomask 120, and a lower side being a sectional view of an EE part shown in the plan view. FIG. 4B is a graph showing an intensity distribution when light from a light source is transmitted through photomask 120 shown in FIG. 4A and an optimal focus is set on the surface of a photoresist. FIG. 4C shows a pattern shape of the photoresist when exposure is carried out with light intensity shown in FIG. 4B: an upper side being a plan view, and a lower side being a sectional view of an FF part shown in the plan view. As in the case described in the BACKGROUND ART, a group of a plurality of dot patterns arranged at equal intervals in a Y direction is referred to as a "dot pattern".

As shown in FIG. 4A, in photomask 120, polygonal pattern 59 formed by integrating a line pattern and a dot pattern is disposed on the rear surface of substrate 9 to extend in the Y direction, and a plurality of dot patterns are arranged in a grid pattern on the rear surface of substrate 9 in the X and Y directions. In this embodiment, in addition to dot patterns 11a and 11b, dot pattern 11c is disposed in area 110 indicated by a broken line.

Figure 1:
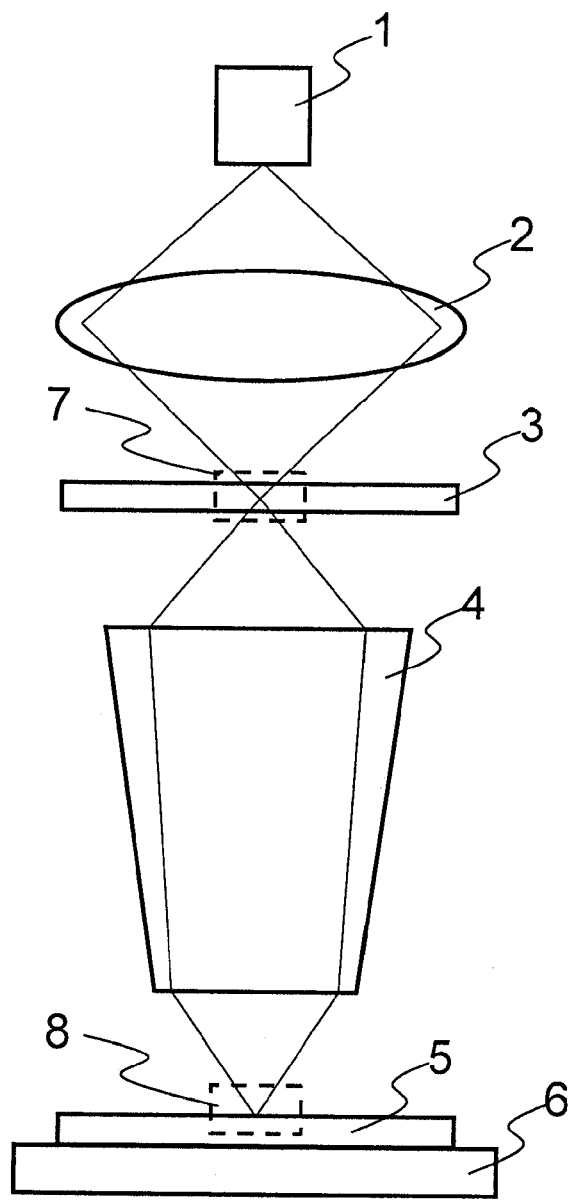
FIG. 1 is a sectional view schematically showing a configuration example of an exposure device.
Figure 2A:
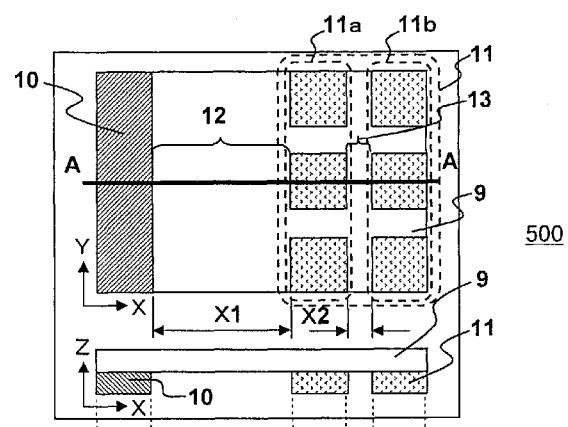
FIGS. 2A to 2C are explanatory views showing exposure process that uses a related photomask.
Figure 2B:
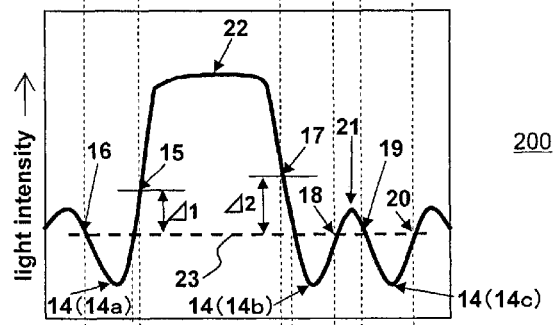
Figure 2C:
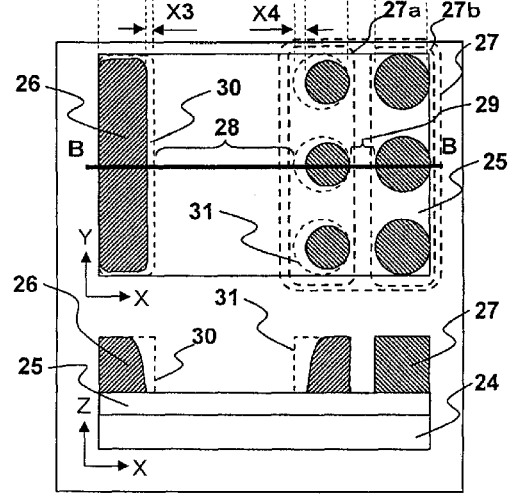
Figure 3A:
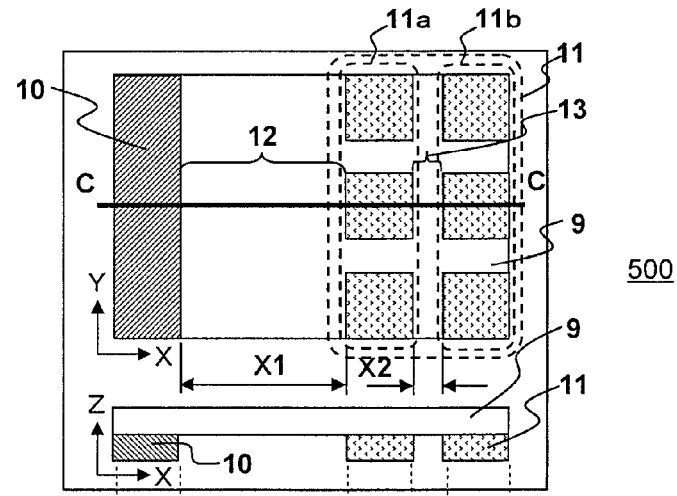
FIGS. 3A to 3C are explanatory views showing a case where defocusing occurs during the exposure process using the related photomask.
Figure 3B:
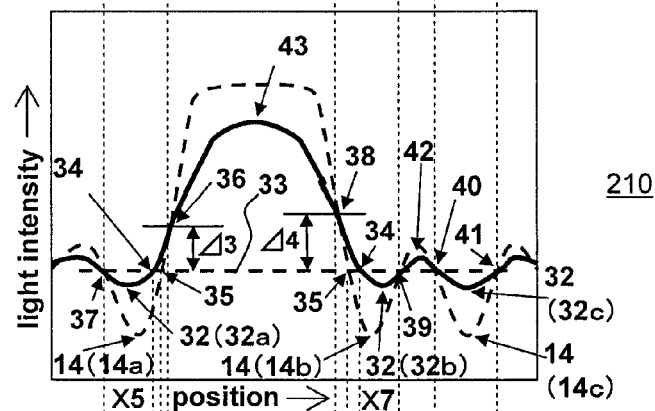
Figure 3C:
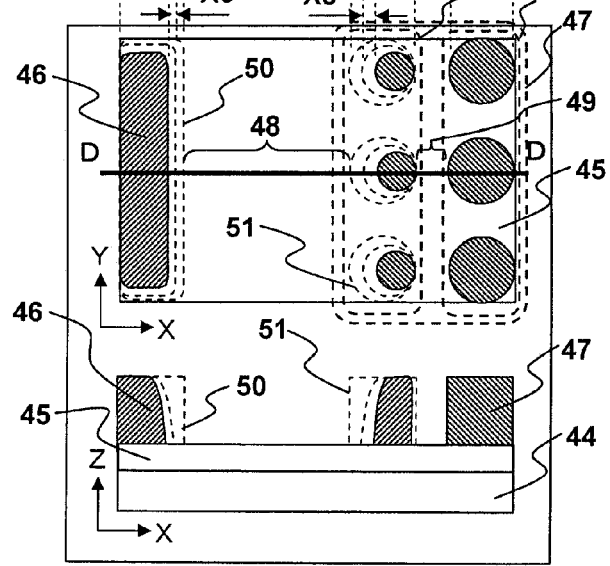

As described below in detail, polygonal pattern 59 corresponds to a pattern having, as an outer shape, a profile configured such that the dot patterns extending in the Y direction are brought into contact with line pattern 10 shown in FIGS. 2A to 2C. The "configuration where the dot patterns are brought into contact with line pattern 10" includes a configuration where the dot patterns overlap line pattern 10".

Dot pattern 11c closest to line pattern 10 is located away from polygonal pattern 59 by space 60, and away from adjacent dot pattern 11a by space 61. Space 60 has width X1 in the X direction, and space 61 also has width X2 in the X direction. Space 13 located between dot pattern 11a and its adjacent dot pattern 11b in the X direction has width X2.

Dot pattern 11c, which is formed by arranging a plurality of dot patterns at equal intervals in the Y direction in space 12 in photomask 500, is similar to dot pattern 11a. Dot pattern 11c is disposed not to form a pattern on a processed film but to prevent fluctuation of light intensity in line pattern 10 and dot pattern 11a. Among patterns serving to prevent fluctuation of the light intensity, a pattern left after development in the lithography process is referred to as a "resolution dummy pattern".

For convenience, the minimum width of polygonal pattern 59 in the X direction is equal to those of dot patterns 11a, 11b, and 11c. The width of space 60 between polygonal pattern 59 and dot pattern 11c is equal to widths X2 of space 13 and space 61. Though not shown, a pattern identical to line pattern 10 is disposed on the left side of polygonal pattern 59 via a space having width X2, and a pattern identical to dot pattern 11b is disposed on the right side of dot pattern 11b via a space having width X2.

In light intensity graph 220 shown in FIG. 4B, a horizontal axis indicates positions of the patterns and the spaces of photomask 120, and a virtual axis indicates light intensity. Light intensity is plotted on the photoresist surface according to the position of each of the patterns and the spaces. FIG. 4B shows threshold value 74 of the light intensity during the development process. In an area of light intensity larger than threshold value 74, a positive photoresist is dissolved during the development.

As shown in FIG. 4B, light intensity 63 at the end of polygonal pattern 59 facing space 60 equal in width to space 13 and space 61 is equal to light intensity 64 at the opposite end. Similarly, light intensity 65 at the end of dot pattern 11c facing space 60 is equal to light intensity 66 at the opposite end. Further, light intensities 67 and 68 at the end of dot pattern 11a facing space 61 are stable at values almost equal to that of light intensity 66, and light intensities 69 and 70 at the end of dot pattern 11b facing space 13 are also almost equal.

The light intensity takes a maximum value at the center of each space. However, even when the abovementioned diffraction phenomenon occurs, maximum value 71 between dot patterns 11a and 11b and maximum value 72 between dot patterns 11a and 11c are equal to maximum value 73 between polygonal pattern 59 and dot pattern 11c.

As described above, the light intensity varies depending on the arrangement of the patterns and the spaces. According to this embodiment, by setting the space widths constant to stabilize a pattern density, the light intensity can be suppressed for excessive fluctuation to be stabilized even in the peripheral part of the area where a plurality of identical patterns are arranged.

FIG. 4C shows a pattern shape of the photoresist when the exposure is carried out with the light intensity shown in FIG. 4B. The photoresist is a positive type. As shown in FIG. 4C, processed film 76 is formed on semiconductor substrate 75 that is a part of a wafer, and the photoresist that becomes a processed mask of processed film 76 is formed on processed film 76. Then, the patterns of photomask 120 are transferred to the photoresist.

The patterns of the photoresist that becomes the processed mask are largely classified into polygonal resist 77 and dot resist 78. Dot resist 78 is further classified into dot resist 78c adjacent to polygonal resist 77 via space 79, and dot resist 78b adjacent to dot resist 78a via space 81. Since the photoresist is the positive type, the photoresist at the exposure place is removed by the development process to form spaces 79, 80, and 81. Dot resist 78c shown in FIG. 4C is formed by forming a photoresist of a plurality of dot patterns in the Y direction in space 28 shown in FIG. 2C. Then, processed film 76 is etched by using the resist pattern shown in FIG. 4C as a mask, thereby forming a pattern corresponding to the resist pattern in processed film 76.

According to this embodiment, polygonal pattern 59 that becomes a photomask of polygonal resist 7 and dot pattern 11c that becomes a photomask of dot resist 78c, cause light diffraction angles at polygonal pattern 59 and dot patter 11a to become stabilized almost equal to that at dot pattern 11b. Thus, the minimum width of polygonal resist 77 takes a value almost equal to that of polygonal pattern 59, and the longest part of dot resist 78a in the X direction is formed with a width almost equal to that of dot pattern 11a.

According to this embodiment, fluctuation of the light intensity caused by diffracted light can be suppressed by setting equal the space widths of the photomasks and arranging the resolution dummy patterns to make the pattern density uniform. As a result, yield reduction caused by resist peeling can be prevented by preventing the resist pattern of, from among the plurality of dot patterns, the pattern closest to the line pattern from becoming smaller than the desired size.

The case of defocusing during the exposure process that uses the photomask of this embodiment is described.

Figure 5A:
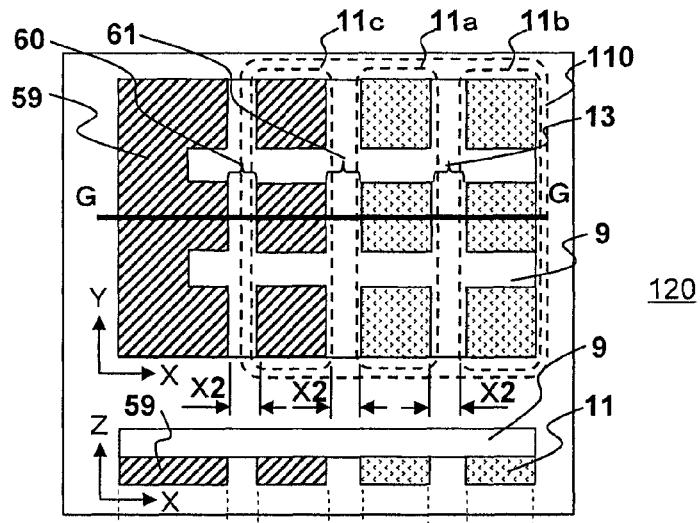
FIGS. 5A to 5C are explanatory views showing a case where defocusing occurs during exposure process using the photomask of this embodiment.
Figure 5B:
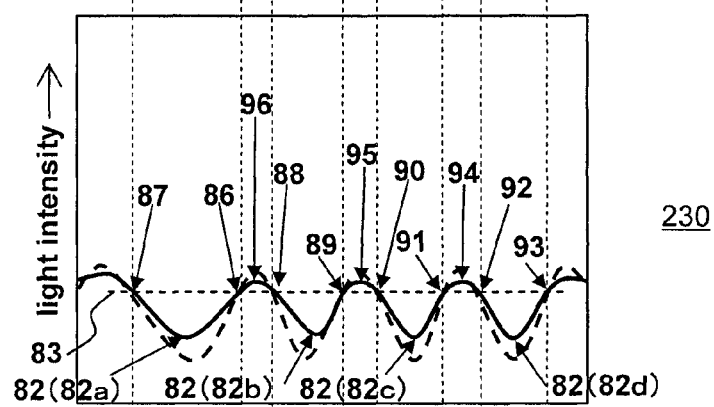
Figure 5C:
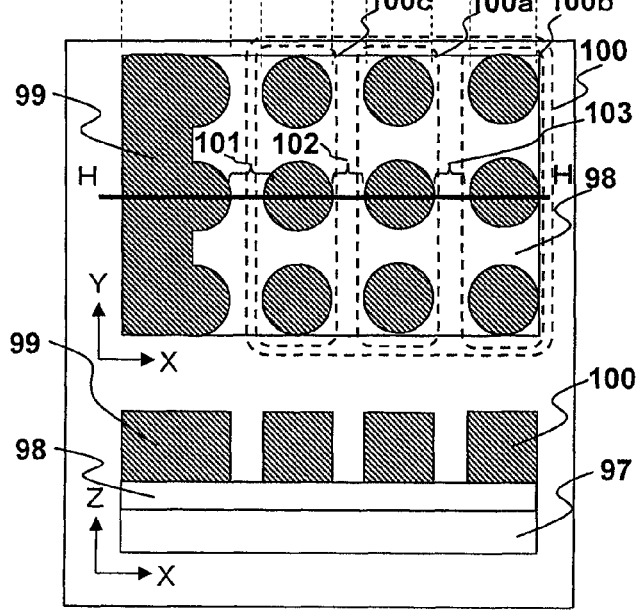

FIG. 5A shows a partial configuration of photomask 120 according to this embodiment: the upper side being a plan view of photomask 120, and the lower side being a sectional view of a GG part shown in the plan view. FIG. 5B is a graph showing intensity distribution when the light from the light source is transmitted through photomask 120 shown in FIG. 5A and defocusing occurs on the surface of the photoresist. FIG. 5C shows the pattern shape of the photoresist when exposure is carried out with the light intensity shown in FIG. 5B: the upper side being a plan view, and the lower side being a sectional view of the HH part shown in the plan view.

Photomask 120 shown in FIG. 5A is similar in configuration to photomask 120 shown in FIG. 4A. To avoid repeated description, description of components similar to those shown in FIG. 4A is omitted.

In light intensity graph 230 shown in FIG. 5B, a horizontal axis indicates positions of the patterns and the spaces of photomask 120, and a virtual axis indicates light intensity. Light intensity is plotted on the photoresist surface according to the position of each of the patterns and the spaces. For comparison, light intensity graph 220 at the time of an optimal focus state shown in FIG. 4B is indicated by a broken line, and threshold value 83 equal to threshold value 74 of the light intensity during the development process is indicated by a broken line. The positive photoresist is dissolved in an area of light intensity larger than threshold value 83.

In light intensity graph 230, the light intensity at the time of the defocusing state, in which the amplitude (difference between maximum value and minimum value) is smaller than that at the time of the optimal focus state, regularly fluctuates from one position to another of the patterns and the spaces. The light intensity becomes minimum value 82 at the center of each of polygonal pattern 59 and dot patterns 11a, 11b, and 11c in photomask 120. Minimum value 82 is larger than minimum value 62 at the time of the optimal focus state because widths of spaces 13, 60, and 61 are all equal. However, there is no fluctuation in position.

Even when there is an influence of diffracted light, light intensities 88 to 93 at the ends of dot patterns 11a, 11b, and 11c are stable at values equal to those of light intensities 65 to 70 at the time of the optimal focus state, and light intensities 86 and 87 at the end of polygonal pattern 59 are also stable at equal values. The light intensity takes a maximum value at the center of each space. However, since spaces 13, 60, and 61 are set equal in width, while maximum values 94 to 96 of the respective spaces are smaller than maximum spaces 71 to 73 at the time of the optimal focus state, there is no fluctuation in position.

The amplitude of light intensity when defocusing occurs during the exposure process is smaller compared with that in the case of the optimal focus state. According to this embodiment, by setting the space widths constant to stabilize the pattern density, the light intensity can be suppressed for excessive fluctuation to be stabilized even in the case of defocusing.

FIG. 5C shows the pattern shape of the photoresist when the exposure is carried out with the light intensity shown in FIG. 5B. The photoresist is a positive type. As shown in FIG. 5C, processed film 98 is formed on semiconductor substrate 97 that is a part of a wafer, and a photoresist that becomes a processed mask of processed film 98 is formed on processed film 98. Then, the patterns of photomask 120 are transferred to the photoresist.

The patterns of the photoresist that becomes the processed mask are largely classified into polygonal resist 99 and dot resist 100. Dot resist 100 is further classified into dot resist 100c adjacent to polygonal resist 99 via space 101, dot resist 100a adjacent to dot resist 100c via space 102, and dot resist 100b adjacent to dot resist 100a via space 103. Since the photoresist is the positive type, the photoresist at the exposure place is removed by the development process to form spaces 101, 102, and 103.

In polygonal resist 99 and dot resists 100a, 100b, and 100c, light intensities at the ends of polygonal pattern 59 and dot patterns 11a, 11b, and 11c in the photomask do not fluctuate even in the defocusing state. Thus, the minimum width of polygonal pattern 59 is almost equal to those of dot patterns 11a, 11b, and 11c.

According to this embodiment, fluctuation of the light intensity caused by diffracted light is suppressed to increase a process margin by arranging resolution dummy patterns to set the space widths of the photomask equal. As a result, yield reduction caused by resist peeling can be prevented by preventing reduction of the resist patterns.

Next, the manufacturing method of a photomask and the forming method of a resist pattern according to this embodiment are described.

Figure 6:
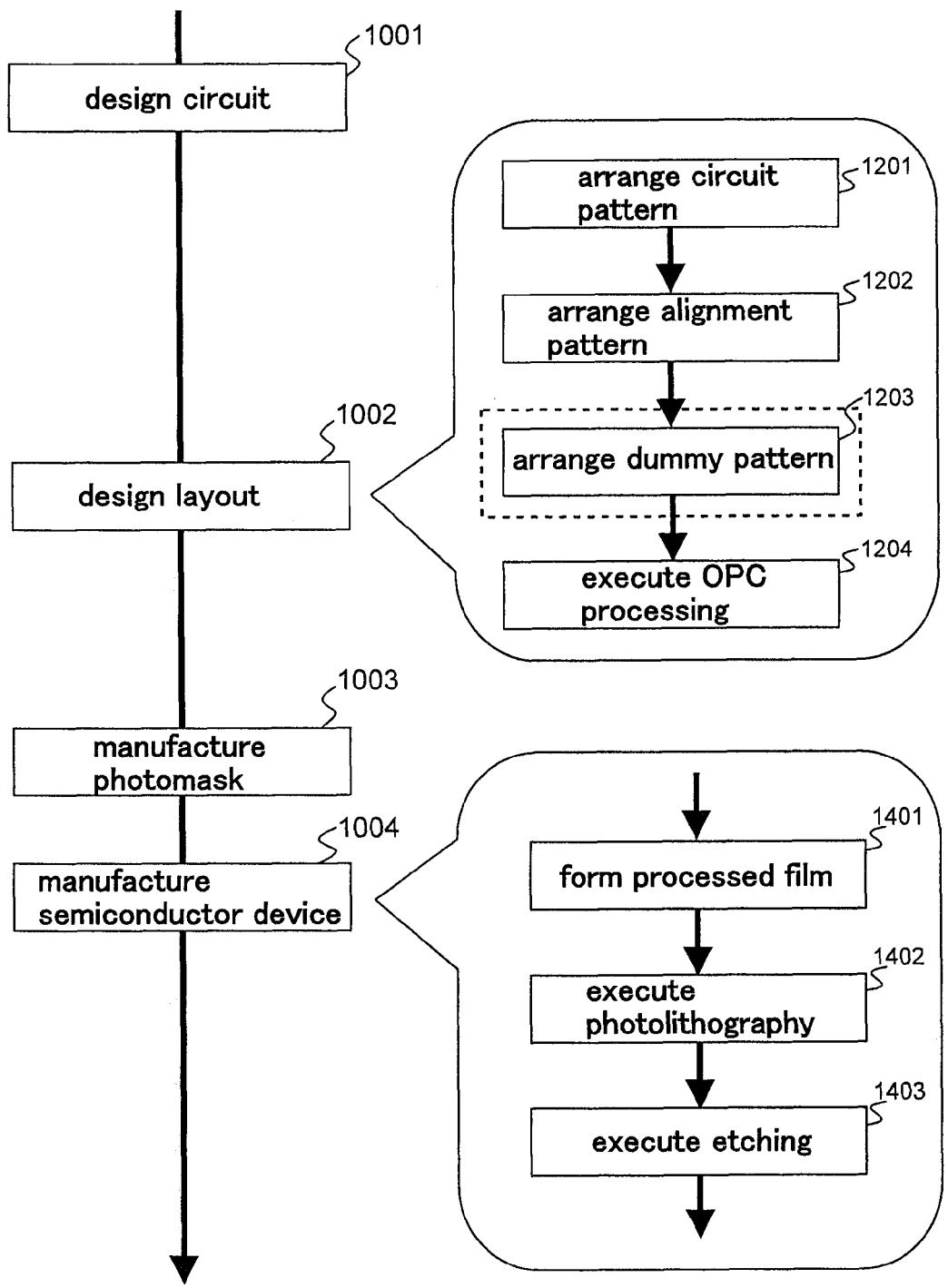
FIG. 6 is a flowchart showing a layout designing method of a semiconductor device, a photomask manufacturing method, and a manufacturing method of the semiconductor device according to this embodiment.

FIG. 6 is a flowchart showing a layout designing method of a semiconductor device, the photomask manufacturing method, and the manufacturing method of the semiconductor device.

As shown in FIG. 6, in step 1001, circuit designing is executed. Then, processing proceeds to step 1002 to execute layout designing, thereby determining arrangements of the components of the semiconductor device. In step 1003, a photomask is formed based on the design specifications. In step 1004, the semiconductor is manufactured by using the photomask.

In the layout designing of step 1002, for example, in step 1201, a circuit pattern is formed. Then, in step 1202, an alignment pattern used in the photolithography process for manufacturing the semiconductor device is formed. In step 1203, a dummy pattern is formed to reduce the size difference between sparse and dense patterns formed by the optical proximity effect of the photolithography process. Then, in step 1204, optical proximity effect correction (OPC) is executed for each arranged pattern to correct the size of the circuit pattern.

In the photomask formation of step 1003, a light shielding film is formed on a glass substrate corresponding to the patterns determined for size and arrangement in the layout designing of step 1002. A photomask can also be formed on a reflective substrate.

In the semiconductor manufacturing of step 1004, in step 1401, a processed film is formed on the semiconductor substrate. In step 1402, the photolithography process of transferring the patterns of the photomask formed in step 1003 to a photoresist applied on the processed film is executed. Then, in step 1403, the etching process of etching the processed film by using the photoresist pattern formed in step 1402 as a mask is executed, thereby forming a desired pattern by the processed film.

This embodiment provides the effect of preventing yield reduction of the semiconductor device by improving pattern processing accuracy in the photolithography process concerning the arrangement of dummy patterns in the layout designing. Hereinafter, the dummy pattern arranging method in step 1203 shown in FIG. 6 is described in detail.

(First Dummy Pattern Arranging Method)

A first dummy pattern arranging method is described. FIGS. 7A to 7D are layout views showing the first dummy pattern arranging method. The method is described by using the reference numerals shown in FIGS. 4A to 4C and in correspondence to the configuration shown in FIGS. 4A to 4C.

Figure 7A:
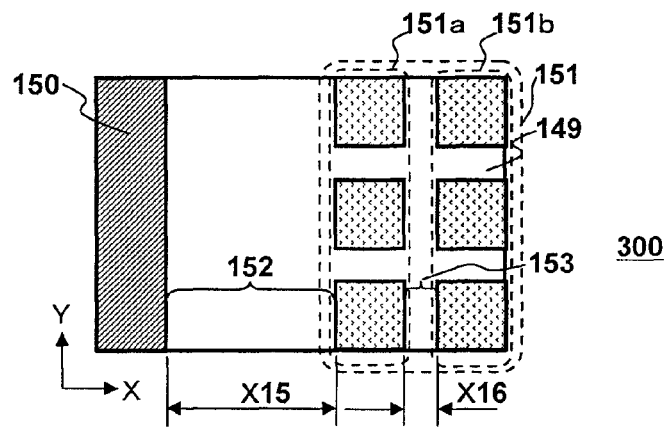
FIGS. 7A to 7F are layout views showing a first dummy pattern arranging method.

As shown in FIG. 7A, layout area 149 of layout 300 includes an area of square 150 formed so that line pattern 10 can extend in the Y direction, and an area of square 151 that includes square 151a having dot pattern 11a and square 151b having dot pattern 11b. In square 151, a plurality of dot patterns is arranged in a grid pattern in the X and Y directions.

Square 151a adjacent to square 150 is located away from square 150 by space 152, and from adjacent square 151b by space 153. In this case, the widths of square 150 and squares 151a and 151b that are lengths in the X direction are equal. Width X15 that is a length of space 152 in the X direction is larger than width X16 that is a length of space 153 in the X direction. A size relationship is represented by (width of square 151a+2×X16)<X15.

Figure 7B:
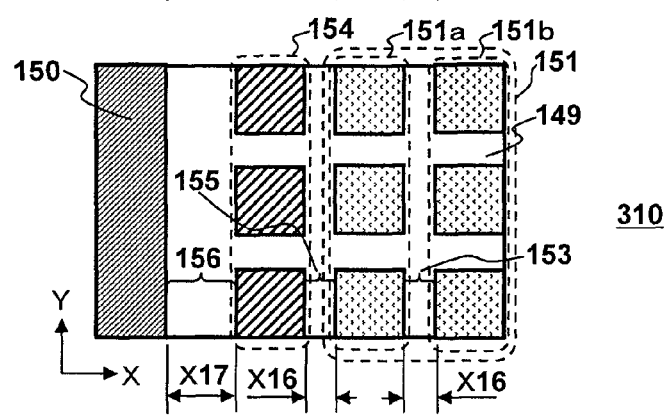

For layout 300 shown in FIG. 7A, as shown in layout 310 of FIG. 7B, in space 152, square 154 in which a plurality of dot patterns that become first resolution dummy patterns are arranged at equal intervals in the Y direction is located to extend in the Y direction. In a device, the first resolution dummy patterns, which are included in square 154, are isolated and not connected to other elements.

Square 154, which is equal in size to squares 151a and 151b, is located away from square 151a, and space 155 having width X16 is located between square 154 and square 151a. In this case, width X17 of space 156 between square 150 and square 154 is smaller than width X15 of space 152. Thus, space 155 equal in width to space 153 is formed between square 154 including the resolution dummy patterns and square 151a to maintain continuity with existing squares 151a and 151b.

Width X17 of space 156 is not always equal to width X16. It is because space 152 is a residual space after squares 150, 151a, and 151b that are essential patterns of a circuit or the like are preferentially arranged and, even when square 154 is subsequently formed, it is rare for the width of newly generated space 156 to become a space width to maintain continuity at the same period as that of spaces 153 and 154.

Figure 7C:
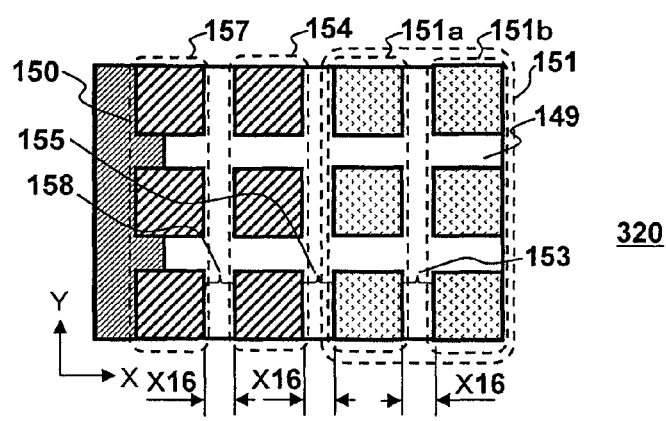

When width X17 is larger than width X16, as shown in layout 320 of FIG. 7C, in space 156, square 157 that includes second resolution dummy patterns is located to extend in the Y direction. Square 157, which is equal in size to square 154, is located away from square 154 by space 158 of width X16. In this case, there is no more space between square 150 and square 157. Square 150 and square 157 are accordingly brought into contact with each other. In square 157 including the resolution dummy patterns, space 158 equal in width to space 153 is therefore formed to maintain continuity with existing squares 151a and 151b. Thus, when square 158 is formed, by adjusting the contact amount (overlapping amount) with square 150, a width of space 158 is set equal to that of space 153, and generation of any extra space between square 150 and square 158 is prevented.

Figure 7D:
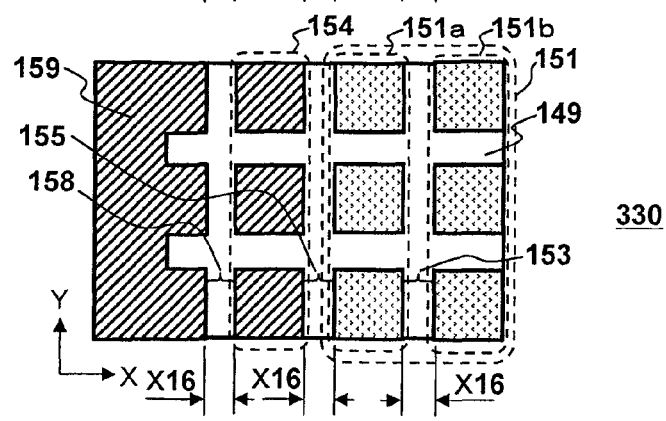

Then, as shown in layout 330 of FIG. 7D, polygon 159 formed by integrating square 150 and square 157 is located in positions where square 150 and square 157 have been present. Polygon 159 makes it possible to form a line pattern including resolution dummy patterns during the semiconductor device manufacturing process. In this case, the width of space 158 is maintained at X16 without fluctuating.

As is apparent from the foregoing, by locating square 157 including the resolution dummy patterns in contact with square 150, the width of newly generated space 158 can be set equal to that of space 153 of existing squares 151a and 151b, and reduction of the photoresist pattern caused by existing square 151a can be prevented.

Figure 7E:
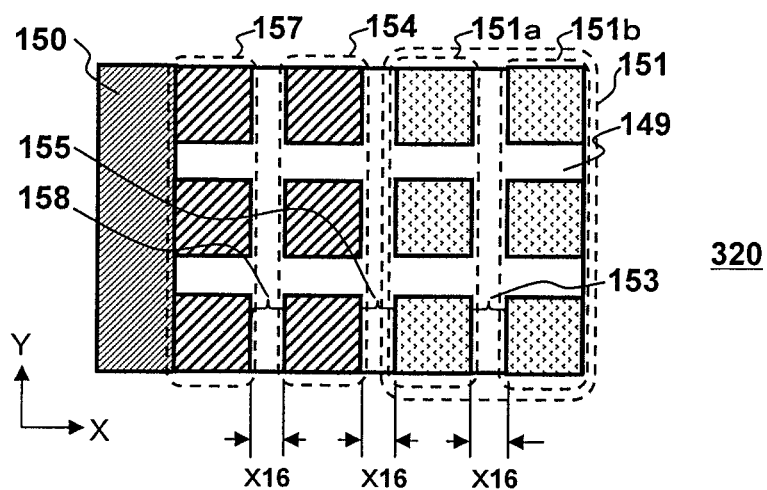

A case where width x17 shown in FIG. 7B is larger than width X16 and X17=(width of square 151a+X16), is described referring to FIG. 7E.

As shown in FIG. 7E, in space 156, square 157 that includes resolution dummy patterns is located to extend in the Y direction. Square 157, which is equal in size to square 154, is located away from square 154 by space 158 of width X16. In this case, there is no more space between square 150 and square 157. The right side wall of Square 150 and the left side wall of square 157 are accordingly brought into contact with each other.

Figure 7F:
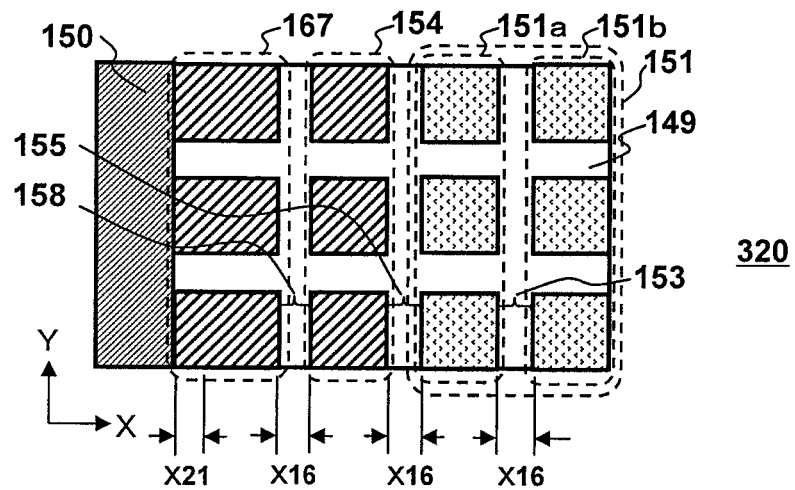

A case where width x17 shown in FIG. 7B is larger than width X16 and (width of square 151a+X16)<X17<(width of square 151a+2×X16), is described referring to FIG. 7F.

As shown in FIG. 7E, in space 156, square 157 that includes resolution dummy patterns is located to extend in the Y direction. Square 157 is located away from square 154 by space 158 of width X16. In this case, a space having width X21 shown in FIG. 7F is formed between square 150 and square 157. Width X21 is smaller than width X16.

In layout 320 shown in FIG. 7F, square 157 shown in FIG. 7E is enlarged in the X direction, and located to be brought into contact with square 150. The description "square 157 is enlarged in the X direction" means, as shown in FIG. 7F, that each of a plurality of dot patterns arranged at equal intervals in the Y direction in square 157 is enlarged in area in the negative direction (left direction shown) of an X axis. Square 167 shown in FIG. 7F corresponds to enlarged pattern of square 157. Square 167, which is larger than square 157, covers the space between square 150 and square 157.

In each of FIGS. 7E and 7F, by locating square 157 or square 167 including the resolution dummy patterns in contact with square 150, the width of newly generated space 158 can be set equal to that of space 153 of existing squares 151a and 151b, and reduction of the photoresist pattern caused by existing square 151a can be prevented.

Square 150 including line pattern 10 finally becomes polygon 159. However, when the pattern of an insulating film is formed by line pattern 10, insulation performance is not deteriorated even if it becomes the insulating pattern of polygon 159. When the wiring pattern of a conductive film is formed, in the case of a wiring pattern of polygon 159, the wiring width is increased to reduce wiring resistance.

In the first dummy pattern arranging method, two rows of dummy patterns are arranged. However, when there is more space between square 150 and square 151a, three or more rows of dummy patterns can be arranged.

(Second Dummy Pattern Arranging Method)

Figure 8A:
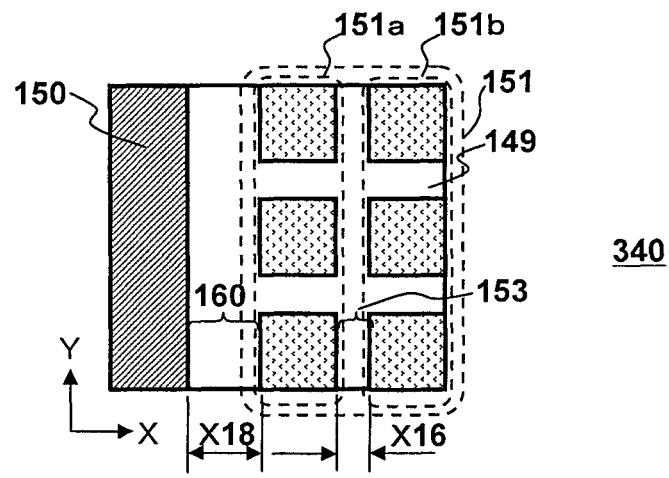
FIGS. 8A to 8C are layout views showing a second dummy pattern arranging method.
Figure 8B:
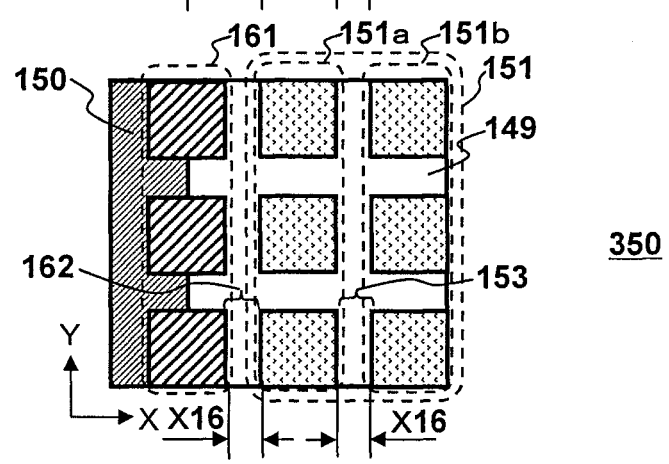
Figure 8C:
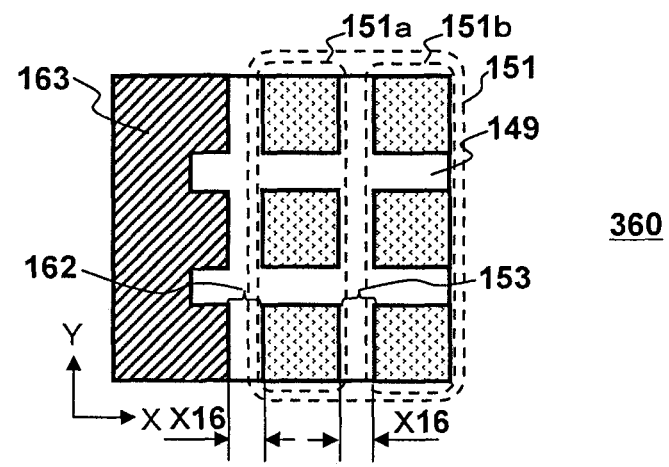

A second dummy pattern arranging method is described. FIGS. 8A to 8c are layout views showing the second dummy pattern arranging method. The method is described by using the reference numerals shown in FIGS. 4A to 4C and in correspondence to the configuration shown in FIGS. 4A to 4C.

As shown in FIG. 8A, layout area 149 of layout 340 includes an area of square 150 formed so that line pattern 10 can extend in the Y direction, and an area of square 151 that includes square 151a having dot pattern 11a and square 151b having dot pattern 11b. In square 151, a plurality of dot patterns is arranged in a grid pattern in the X and Y directions.

Square 151a adjacent to square 150 is located away from square 150 and space 160 is located between square 151a and square 150. Square 151a is located away from adjacent square 151b and space 153 is located between square 151a and square 151b. In this case, widths of square 150 and squares 151a and 151b that are lengths in the X direction are equal. Width X18 that is a length of space 160 in the X direction is larger than width X16 that is a length of space 153 in the X direction, and equal to or less than a sum of width X16 of space 153 and a width of square 151a. In other words, the size relationship is represented by X16≤X18≤(width of square 151a+X16). When width X18 of space 160 is smaller than the sum of width X16 of space 153 and the width of square 151a, the size of layout area 149 is reduced, enabling reduction of the occupied area of the semiconductor device.

For layout 340 shown in FIG. 8A, as shown in layout 350 of FIG. 8B, in space 160, square 161 in which a plurality of dot patterns that become resolution dummy patterns are arranged at equal intervals in the Y direction is located in contact with square 150 to extend in the Y direction.

In square 161 shown in FIG. 8B, that is formed as a resolution dummy pattern, shape of a part of square 161 that is projected from square 150, is similar to each shape of squares 151a, 151b.

Square 161, which is equal in size to squares 151a and 151b, is located away from square 151a, and space 162 having width X16 is located between square 161 and square 151a. In this case, no new space is generated in addition to space 162 in space 160. Thus, by disposing square 161 including the resolution dummy patterns in contact with square 150, space 162 equal in width to width X16 of space 153 can be formed between square 161 and square 151a to maintain continuity with existing squares 151a and 151b.

Then, as shown in layout 360 of FIG. 8C, polygon 163 formed by integrating square 150 and square 161 is located in positions where square 150 and square 161 have been present. Polygon 163 makes it possible to form a line pattern including resolution dummy patterns during the semiconductor device manufacturing process. In this case, the width of space 162 is maintained at X16 without fluctuating.

As is apparent from the foregoing, by locating square 161 including a row of resolution dummy patterns in contact with square 150, the width of newly generated space 162 can be set equal to that of space 153 of existing squares 151a and 151b, and reduction of the photoresist pattern caused by existing square 151a can be prevented.

Square 150 including line pattern 10 finally becomes polygon 163. However, when the pattern of an insulating film is formed by line pattern 10, insulation performance is not deteriorated even if it becomes an insulating pattern of polygon 163. When the wiring pattern of a conductive film is formed, in the case of the wiring pattern of polygon 163, the wiring width is increased to reduce wiring resistance.

Figure 9A:
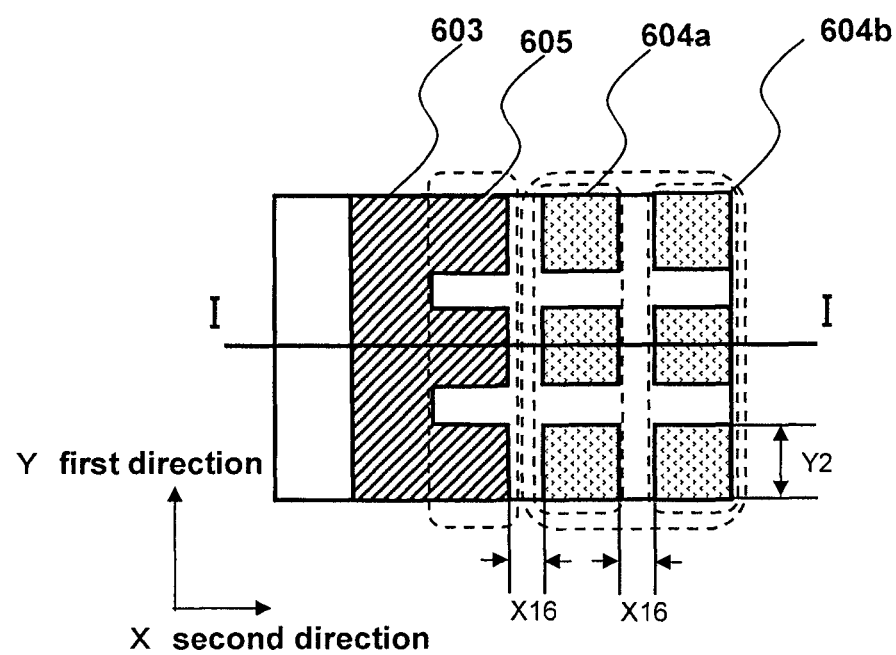
FIG. 9A is a plan view showing an example of the semiconductor device according to this embodiment.
Figure 9B:
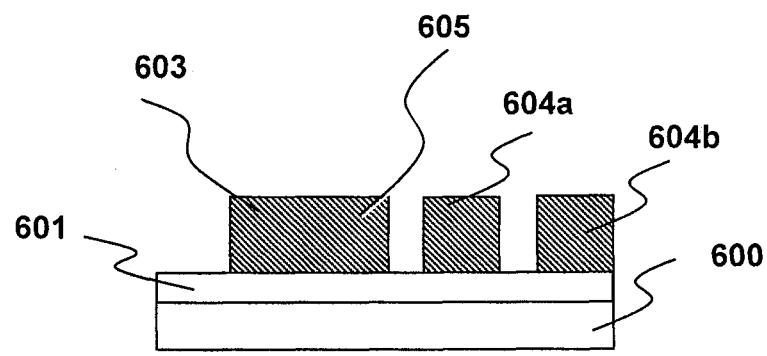
FIG. 9B is a sectional view showing the example of the semiconductor device according to this embodiment.

FIG. 9A is a plan view showing an example of a semiconductor device manufactured by using the photomask by this arranging method. FIG. 9B is a sectional view showing an example of the II part of the semiconductor device shown in FIG. 9A. The Y direction is a first direction, and the X direction is a second direction.

As shown in FIGS. 9A and 9B, insulating film 601 is formed on substrate 600, and wiring pattern 603 that is a line pattern and dot patterns 604a and 604b are formed on insulating film 601. Wiring pattern 603 has projection part 605 projected toward dot pattern 604a.

A width of projection part 605 in the first direction is substantially equal to widths Y2 of dot patterns 604a and 604b in the first direction. Projection part 605 in the photomask has a size to be left as a pattern after development as shown in FIGS. 9A and 9B. The distance of the interval between dot patterns 604a and 604b in the second direction is X16, and the distance of the interval between projection part 605 and dot pattern 604a formed closest to projection part 605 is also X16. These intervals are substantially equal.

According to the semiconductor device shown in FIGS. 9A and 9B, since there is projection part 605 projected from the end of wiring pattern 603 toward dot pattern 604a, the influence of diffracted light during exposure process is suppressed, and dot pattern 604a closest to wiring pattern 603 is prevented from being formed smaller than a desired size.

(Third Dummy Pattern Arranging Method)

A third dummy pattern arranging method is described. FIGS. 10A to 10D are layout views showing the third dummy pattern arranging method.

Figure 10A:
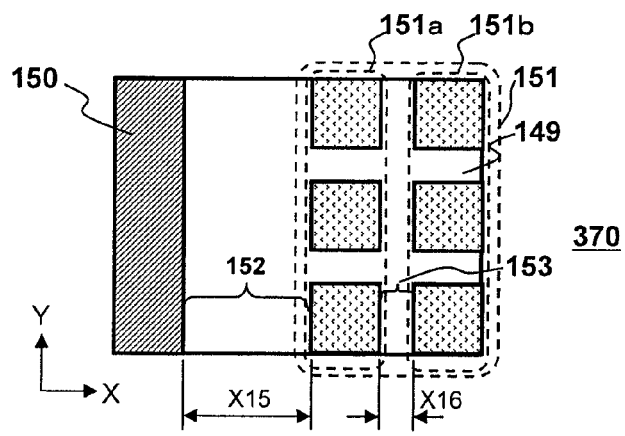
FIGS. 10A to 10D are layout views showing a third dummy pattern arranging method.
Figure 10B:
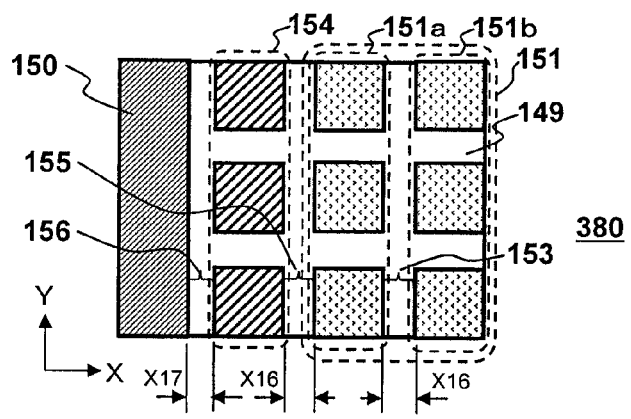

The method is described by using the reference numerals shown in FIGS. 4A to 4C and in correspondence to the configuration shown in FIGS. 4A to 4C. Layout 370 shown in FIG. 10A is similar in configuration to layout 300 shown in FIG. 7A, and layout 380 shown in FIG. 10B is similar in configuration to layout 310 shown in FIG. 7B. Thus, detailed description thereof is omitted. However in this case, it is assumed that (width of square 151a+X16)<X15≤(width of square 151a+2×X16).

Figure 10C:
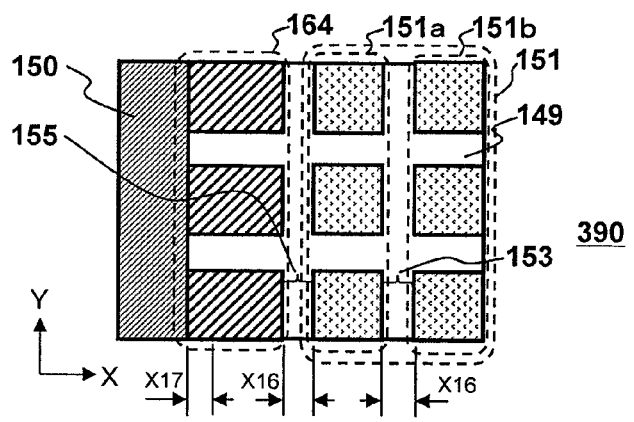

In layout 390 shown in FIG. 10C, square 154 shown in layout 380 of FIG. 10B is enlarged in the X direction, and located to be brought into contact with square 150. The description "square 154 is enlarged in the X direction" means, as shown in FIG. 10C, that each of a plurality of dot patterns arranged at equal intervals in the Y direction in square 154 is enlarged in area in the negative direction (left direction shown) of an X axis. Square 164, which is larger than square 154, covers the part of space 156 extending in the Y direction to remove the space between square 150 and square 154.

Thus, square 164 including resolution dummy patterns is formed to maintain continuity with existing squares 151a and 151b. As a result, the arrangement of square 164 prevents generation of any extra space between square 150 and square 164 by enlarging square 154 in the X direction to maintain the width of space 155 equal to that of space 153.

In square 164 shown in FIG. 10C, that is formed as a resolution dummy pattern by enlarging square 154, shape of square 164 which includes enlarged part, is similar to shape of square 151.

Figure 10D:
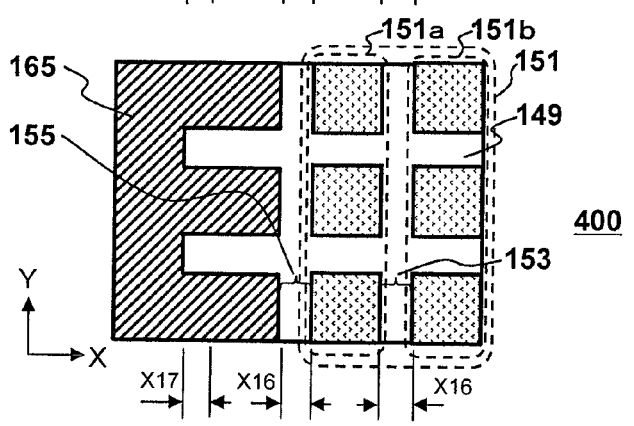

Then, as shown in layout 400 of FIG. 10D, polygon 165 formed by integrating square 150 and square 164 is located in positions where square 150 and square 164 have been present. Polygon 165 makes it possible to form a line pattern including resolution dummy patterns during the semiconductor device manufacturing process. In this case, the width of space 155 is maintained at X16 without fluctuating.

Thus, by arranging square 164 including the resolution dummy patterns to be in contact with square 150, the width of newly generated space 155 can be set equal to that of space 153 of existing squares 151a and 151b, and reduction of the photoresist pattern caused by existing square 151a can be prevented. In particular, when width X15 of space 152 is represented by (width of square 151a+X16)<X15≤(width of square 151a+2×X16), there is no need to arrange any extra dummy pattern. This dummy pattern arranging method is therefore effective.

Square 150 including line pattern 10 finally becomes polygon 165. However, when the pattern of the insulating film is formed by line pattern 10, insulation performance is not deteriorated even if it becomes the insulating pattern of polygon 165. When the wiring pattern of a conductive film is formed, in the case of the wiring pattern of polygon 165, the wiring width is increased to reduce wiring resistance.

(Fourth Dummy Pattern Arranging Method)

A fourth dummy pattern arranging method is described. FIGS. 11A to 11D are layout views showing the fourth dummy pattern arranging method.

Figure 11A:
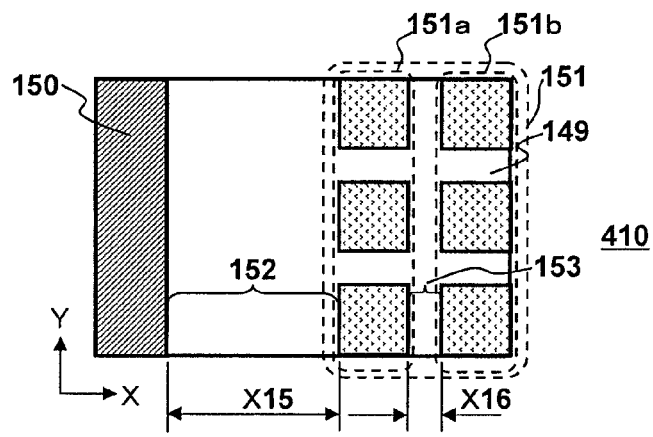
FIGS. 11A to 11D are layout views showing a fourth dummy pattern arranging method.
Figure 11B:
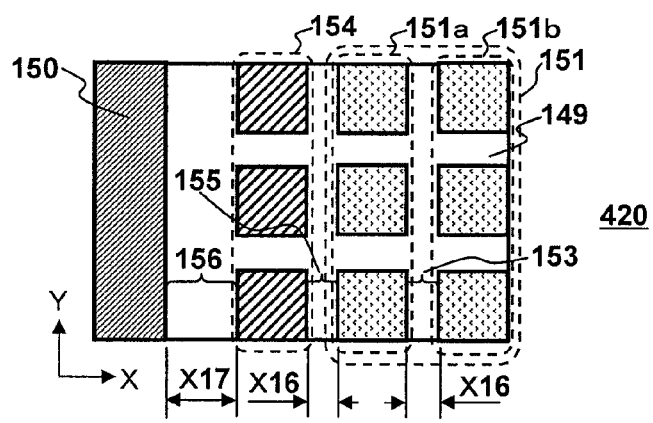

The method is described by using the reference numerals shown in FIGS. 4A to 4C and in correspondence to the configuration shown in FIGS. 4A to 4C. Layout 410 shown in FIG. 11A is similar in configuration to layout 300 shown in FIG. 7A, and layout 420 shown in FIG. 11B is similar in configuration to layout 310 shown in FIG. 7B. Thus, detailed description thereof is omitted.

Figure 11C:
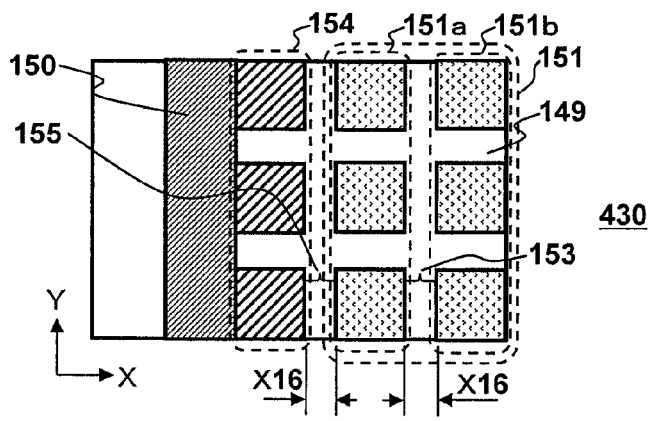

As shown in layout 430 of FIG. 11C, square 150 shown in FIG. 11B is moved in the positive direction (right direction shown) of the X axis, and located so as to be brought into contact with square 154. The width of square 150 after the movement is equal to that before movement. Square 150 completely covers space 156 extending in the Y direction to remove the space between square 150 and square 154.

Thus, square 154 including resolution dummy patterns is formed to maintain continuity with existing squares 151a and 151b. By bringing square 150 close to square 154, generation of any extra space between square 150 and square 154 can be prevented while maintaining the width of space 155 equal to that of space 153.

Figure 11D:
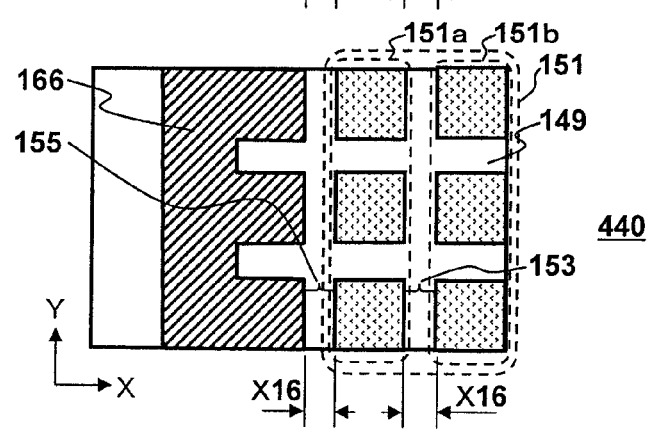

Then, as shown in layout 440 of FIG. 11D, polygon 166 formed by integrating square 150 and square 154 is located in positions where square 150 and square 154 have been present. Polygon 166 makes it possible to form a line pattern including resolution dummy patterns during the semiconductor device manufacturing process. In this case, the width of space 155 is maintained at X16 without fluctuating. Then, OPC process is carried out for polygon 166 to correct its size.

Thus, by arranging square 154 including the resolution dummy patterns to be in contact with square 150, the width of newly generated space 155 can be set equal to that of space 153 of existing squares 151a and 151b, and reduction of the photoresist pattern caused by existing square 151a can be prevented.

Square 150 including line pattern 10 finally becomes polygon 166. However, when a pattern of an insulating film is formed by line pattern 10, insulation performance is not deteriorated even if it becomes an insulating pattern of polygon 166. When a wiring pattern of a conductive film is formed, in the case of a wiring pattern of polygon 166, the wiring width is increased to reduce wiring resistance.

(Fifth Dummy Pattern Arranging Method)

A fifth dummy pattern arranging method is described.

Figure 12A:
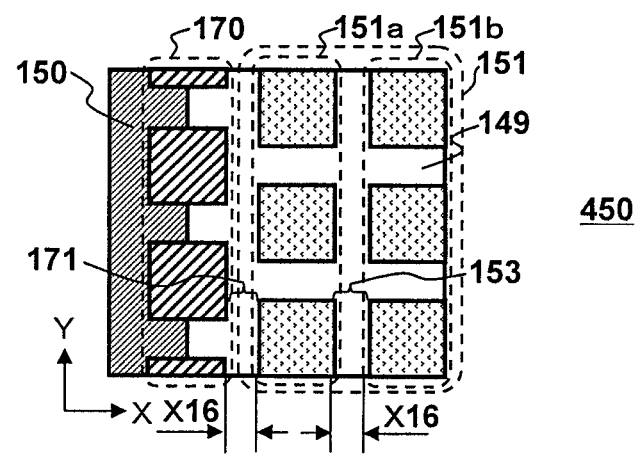
FIGS. 12A and 12B are layout views showing a fifth dummy pattern arranging method.
Figure 12B:
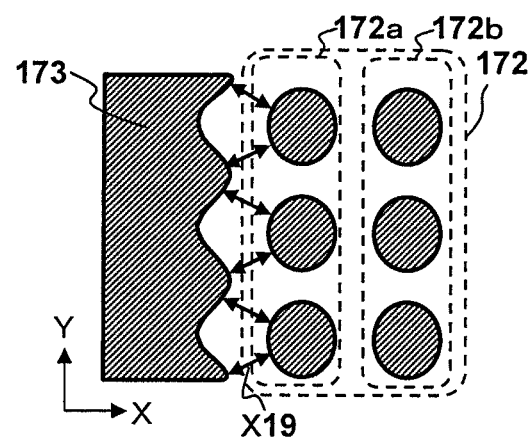

FIG. 12A is a layout view showing the fifth dummy pattern arranging method. FIG. 12B is a plan view showing a resist pattern formed by using a photomask by the dummy pattern arranging method shown in FIG. 12A.

FIG. 12A is the layout view after resolution dummy patterns are arranged in layout 340 shown in FIG. 8A by the fifth dummy pattern arranging method. FIG. 12A accordingly corresponds to FIG. 8B showing the second dummy pattern arranging method, not a final layout view similar to that shown in FIG. 8C. The method is described by using the reference numerals shown in FIGS. 4A to 4C and FIGS. 8A to 8C and in correspondence to the configurations shown in FIGS. 4A to 4C and FIGS. 8A to 8C.

As shown in FIG. 12A, layout area 149 of layout 450 includes the area of square 150 formed so that line pattern 10 can extend in the Y direction, and the area of square 151 that includes square 151a having dot pattern 11a and square 151b having dot pattern 11b. In square 151, a plurality of dot patterns is arranged in a grid pattern in the X and Y directions.

Square 151a adjacent to square 150 is located away from square 151b adjacent in the X direction and space 153 having width X16 is located between square 151a and square 151b. Square 170 including resolution dummy patterns is located in contact with square 150 to extend in the Y direction. Square 170 has a size equal to those of squares 151a and 151b, and space 171 of width X16 is generated between square 170 and square 151a. The plurality of dot patterns included in square 170 correspond to the resolution dummy patterns.

In this dummy pattern arranging method, the plurality of dot patterns included in square 170, which is equal in pitch to the plurality of dot patterns in square 151a, is shifted by half a pitch from the plurality of dot patterns in square 151a in the Y direction. The half pitch is half the distance between the centers of the dot patterns adjacent to each other.

The resist pattern formed by executing exposure process and development process using a photomask in which layout 450 shown in FIG. 12B is a final layout is as shown in FIG. 12B. When the patterns of the areas of square 150 and square 170 shown in FIG. 12A are transferred to the photoresist, line resist 173 shown in FIG. 12B is formed. When the patterns of the areas of squares 151a and 151b shown in FIG. 12A are transferred to the photoresist, dot resists 172a and 172b shown in FIG. 12B are formed.

As shown in FIG. 12B, distance X19 between dot resist 172a and line resist 173 becomes roughly constant in the circumferential direction of each dot pattern in dot resist 172a. This is because as shown in layout 450, the resolution dummy patterns are shifted by half a pitch to suppress fluctuation of light intensity caused by diffracted light and, as a result, the width of dot resist 172a can be set equal to that of dot resist 172b.

This dummy pattern arranging method has been described as an example of the second dummy pattern arranging method. However, this method can be applied to any of the first to fourth dummy pattern arranging methods.

(Sixth Dummy Pattern Arranging Method)

Figure 13A:
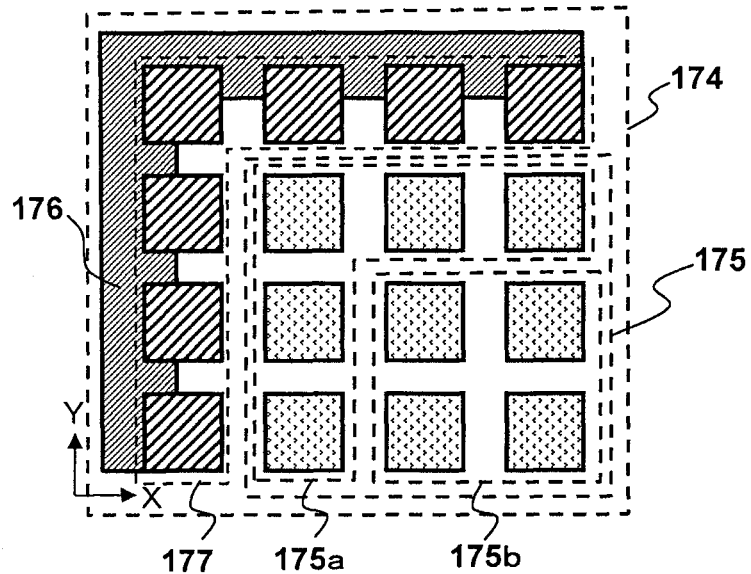
FIGS. 13A and 13B are layout views showing a sixth dummy pattern arranging method.
Figure 13B:
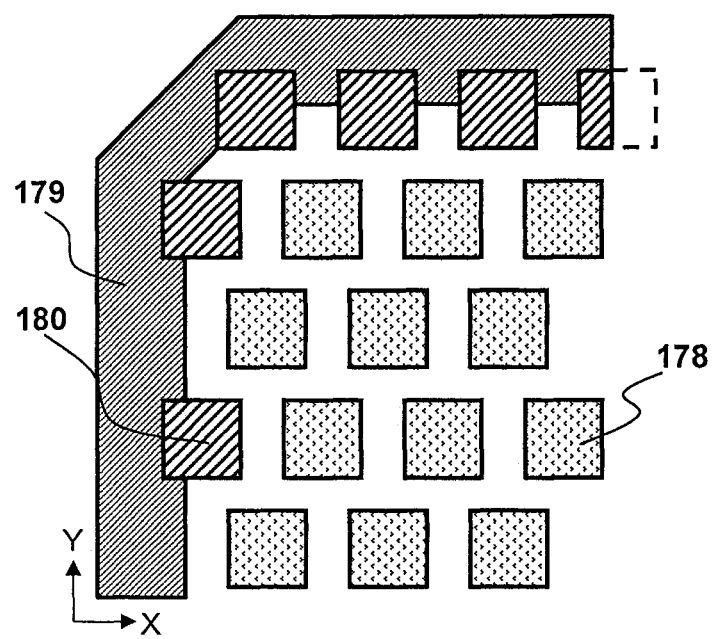

A sixth dummy pattern arranging method is described. FIGS. 13A and 13B are explanatory layout views showing the sixth dummy pattern arranging method.

FIG. 13A is a layout view showing the dummy pattern arranging method at the corner of the area where a plurality of dot patterns are arranged in a grid pattern in the X and Y directions. FIG. 13B is a layout view showing another dummy pattern arranging method. FIGS. 13A and 13B, which are not final layout views, correspond to the layout view of FIG. 11B by the fourth dummy pattern arranging method.

Layout area 174 shown in FIG. 13A corresponds to the corner of the area where the plurality of dot patterns are arranged in the grid pattern in the X and Y directions. Referring to FIG. 13A, in layout area 174, polygon 175 including an L-shaped line pattern is formed outside square 175 along the two sides of square 175 including the plurality of dot patterns arranged in the grid pattern in the X and Y directions. In the area of square 175, polygon 175a that includes a plurality of dot patterns is formed along the two sides of square 175b that includes a plurality of dot patterns. Polygon 175a corresponds to the outermost peripheral part of the area of square 175, and a row where dot patterns are arranged at equal intervals in the X direction in polygon 175a is referred to as the outermost row.

For a circuit pattern arrangement, according to this dummy pattern arranging method, polygon 17 including resolution dummy patterns, which is brought into contact with polygon 176 in the X and Y directions, is formed to maintain continuity of the dot pattern arrangement in square 175.

Thus, by arranging polygon 177 to bring the resolution dummy patterns into contact with the line pattern along the L shape, as described above referring to FIGS. 12A and 12B, the width of the dot resist formed by polygon 175a adjacent to polygon 176 can be set equal to that of the dot resist formed by polygon 175b without being reduced.

In this dummy pattern arranging method, the second dummy pattern arranging method is applied not only to the X-direction arrangement of the plurality of dot patterns but also to the Y-direction arrangement. Any one of the first, third, and fourth dummy pattern arranging methods can be applied not only to the X-direction arrangement of the plurality of dot patterns but also to the Y-direction arrangement.

FIG. 13B is a layout view showing the method for arranging dummy patterns in a circuit pattern different from that shown in FIG. 13A. In the layout shown in FIG. 13B, a plurality of rows, each of which includes a plurality of dot patterns 178 arranged at equal intervals in the X direction, is provided, and each row is shifted by half a pitch from its adjacent row in the X direction. Polygon 179 including a line pattern is located outside the area where the plurality of dot patterns 178 are arranged in a zigzag grid pattern in the X and Y directions. The position of polygon 179 with respect to the plurality of dot patterns 178 is similar to those of polygon 176 and square 175 shown in FIG. 13A.

For such a circuit pattern, as shown in FIG. 13B, resolution dummy patterns 180 are arranged in contact with polygon 179 in the X and Y directions to maintain the X and Y-direction continuity of dot patterns 178 arranged in the zigzag grid pattern. Even when the plurality of dot patterns are arranged in the zigzag grid pattern, as shown in FIG. 13B, by arranging resolution dummy patterns 180 in contact with polygon 179 that becomes a line pattern, effects similar to those in the case shown in FIG. 13A can be provided.

The first to sixth dummy pattern arranging methods have been described by way of example where the dot patterns, the line pattern, and the resolution dummy patterns all become photoresist patterns. Even when these patterns become photoresist openings, similar effects can be provided.

Figure 14:
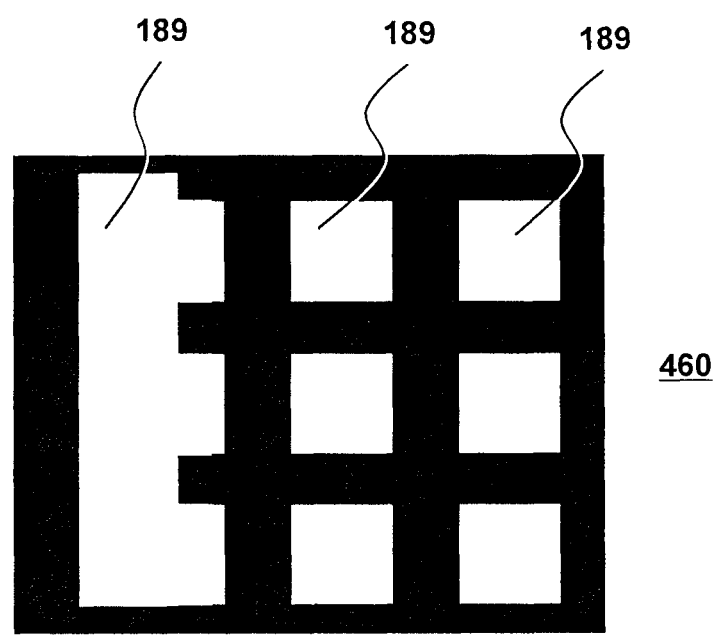
FIG. 14 is a layout view when the brightness and darkness of each pattern arranged by the second dummy pattern arranging method are reversed.

FIG. 14 is a layout view showing a case where each pattern arranged by the second dummy pattern arranging method is reversed. The reversal means processing for reversing bright and dark areas of the photomask. The layout view of FIG. 14 is a reversal of a layout (refer to FIG. 8B) after the resolution dummy patterns and the line pattern have been integrated.

Through this process, the areas of the photomask that become resist patterns after development can be openings. In this case, a line pattern in FIG. 8B corresponds to a slit pattern in a device which will be manufactured by the photomask shown in FIG. 14 and a dot pattern in FIG. 8B corresponds to a hole pattern in the device. In the second dummy pattern arranging method, square 150 and square 161 shown in FIG. 8B are integrated, and square 163 shown in FIG. 8C is located in positions where square 150 and square 161 have been present. In this case, square 150 and square 161 are integrated to be reversed, and squares 151a and 151b are reversed. The patterns accordingly become openings 189 as shown in layout 460 of FIG. 14.

Dot patterns, a line pattern, and resolution dummy patterns can be formed by using negative photoresists.

The embodiments have been described by an example in which the dot patterns are square. However, the dot patterns can be a circular or regular polygonal.

It is apparent that the present invention is not limited to the above embodiments, but may be modified and changed without departing from the scope and spirit of the invention.

In at least one embodiment from among the embodiments, a photomask of one embodiment comprises a first pattern and a plurality of second patterns arranged at equal intervals. When a distance of a first space between the first pattern and, from among the plurality of second patterns, the second pattern closest to the first pattern is larger than a sum of a width of the second pattern and double the intervals of the plurality of second patterns, a plurality of dummy patterns are arranged in the first space with shapes and intervals similar to those of the second patterns. When the distance of the first space is equal to or less than the sum of the width of the second pattern and double the intervals of the plurality of second patterns, and larger than a sum of the width of the second pattern and the intervals of the plurality of second patterns, a dummy pattern similar in shape to the second pattern is spaced from the second pattern closest to the first pattern, and extends toward the first pattern to be brought into contact with the first pattern. When the distance of the first space is equal to or less than the sum of the width of the second pattern and the intervals of the plurality of second patterns, a dummy pattern similar in shape to the second pattern is spaced from the second pattern closest to the first pattern, and is connected to the first pattern.

In the photomask, when the distance of the first space is larger than the sum of the width of the second pattern and double the intervals of the plurality of second patterns, a part of the plurality of dummy patterns may overlap the first pattern.

In the photomask, a plurality of rows, when each of which includes the plurality of second patterns arranged in a first direction, are arranged at equal intervals in a second direction intersecting the first direction and in the plurality of rows, positions of the second patterns in the rows adjacent to each other match each other, the plurality of dummy patterns may be arranged along the first pattern at intervals equal to the intervals of the rows in the second direction.

In the photomask, a center of the intervals of the dummy patterns arranged in the second direction may not match a center of the intervals of the rows.

In the photomask, when a plurality of rows, each of which includes the plurality of second patterns arranged in a first direction, are arranged at equal intervals in a second direction intersecting the first direction and in the plurality of rows, positions of the second patterns in the rows adjacent to each other do not match each other, the plurality of dummy patterns may be arranged at intervals equal to the intervals of the rows in the second direction.

In the photomask, when a third pattern is disposed outside an outermost row located in an outermost peripheral part of an area in which the plurality of rows are arranged to be parallel with the outermost row, in a second space between the third pattern and the second pattern in the outermost row, the dummy patterns may be arranged according to the arrangement of the dummy patterns with respect to the first space.

In at least one embodiment from among the embodiments, a photomask comprises a first pattern and a plurality of second patterns arranged at equal intervals. Between the first pattern and, from among the plurality of second patterns, the second pattern closest to the first pattern, first dummy patterns are arranged from the second pattern closest to the first pattern toward the first pattern with shapes and intervals similar to those of the second patterns. When a distance of a space between the first pattern and the first dummy pattern is smaller than a sum of a width of the second pattern and the intervals of the plurality of second patterns, and larger than the intervals of the plurality of second patterns, second dummy patterns are arranged in the space with shapes and intervals similar to those of the plurality of second patterns spaced from the first dummy patterns to overlap the first pattern. When the distance of the space is equal to the sum of the width of the second pattern and the intervals of the plurality of second patterns, second dummy patterns are arranged in the space with shapes and intervals similar to those of the plurality of second patterns spaced from the first dummy patterns to be brought into contact with the first pattern. When the distance of the space is equal to or less than the intervals of the plurality of second patterns, the first dummy patterns extend to be brought into contact with the first pattern.

In at least one embodiment from among the embodiments, a photomask comprises a line pattern extending in a first direction, a plurality of dot patterns formed on a line at equal intervals in a second direction which intersects the first direction, and a projection part projected from an end of the line pattern toward the dot patterns in the second direction.

In the photomask, a width of the projection part in the first direction may be substantially equal to that of the dot pattern in the first direction.

In the photomask, the projection part may remain on a substrate after development.

In the photomask, an interval between the dot patterns adjacent to each other in the second direction may be substantially equal to that between the projection part and the dot pattern closest to the projection part in the second direction.

In the photomask, an interval between the projection part and the dot pattern closest to the projection part may be an interval in which the dot patterns are not affected by defocusing.

What is claimed is:

1. A semiconductor device comprising:
   a line pattern extending in a first direction;
   a plurality of dot patterns formed in line at equal intervals in a second direction, the second direction intersecting the first direction; and
   a projection part projected from an end of the line pattern toward the dot patterns in the second direction, the projection part being in a same layer of the semiconductor device as the line pattern and the plurality of dot patterns.

2. The semiconductor device according to claim 1, wherein a width of the projection part in the first direction is substantially equal to that of the dot pattern in the first direction.

3. The semiconductor device according to claim 1, wherein an interval between the dot patterns adjacent to each other in the second direction is substantially equal to that between the projection part and the dot pattern closest to the projection part in the second direction.

4. The semiconductor device according to claim 1, wherein the projection part and a row of the dot patterns closest to the projection part are substantially in line in the second direction.

5. The semiconductor device according to claim 1, wherein a center position between two of the projection part that are adjacent to each other in the first direction and a row of the dot patterns closest to the center position are substantially in line in the second direction.

6. The semiconductor device according to claim 1, wherein a plurality of rows, each of which includes a plurality of the dot patterns arranged in the second direction, are arranged at equal intervals in the first direction.

7. The semiconductor device according to claim 6, wherein the plurality of rows that are adjacent to each other in the first direction are arranged with a half pitch shift in the second direction.

8. A semiconductor device comprising:
   a first line pattern extending in a first direction;
   a plurality of first dot patterns in line at equal intervals in a second direction intersecting the first direction;
   a second line pattern extending in the second direction;
   a plurality of second dot patterns in line at equal intervals in the first direction; and
   a projecting part projecting in the first direction from the second line pattern toward the second dot patterns,
   wherein
   the first line pattern is longer in the first direction than the second direction,
   the second line pattern is longer in the second direction than the first direction,
   the first dot patterns are shorter in the first direction than the first line pattern, and
   the second dot patterns are shorter in the second direction than the second line pattern.

9. The semiconductor device according to claim 8, wherein an end of the first line pattern and an end of the second line pattern contact each other.

* * * * *